United States Patent
Park

(10) Patent No.: US 10,218,266 B2
(45) Date of Patent: Feb. 26, 2019

(54) DC-DC CONVERTER, AND DISPLAY DEVICE INCLUDING THE SAME

(71) Applicant: Samsung Display Co., Ltd., Yongin-Si, Gyeonggi-Do (KR)

(72) Inventor: Sungchun Park, Suwon-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 0 days.

(21) Appl. No.: 15/865,857

(22) Filed: Jan. 9, 2018

(65) Prior Publication Data

US 2018/0212513 A1   Jul. 26, 2018

(30) Foreign Application Priority Data

Jan. 25, 2017   (KR) .................. 10-2017-0012134

(51) Int. Cl.
*H02M 3/06* (2006.01)
*H02M 3/10* (2006.01)
(Continued)

(52) U.S. Cl.
CPC ............ *H02M 3/06* (2013.01); *G01R 31/024* (2013.01); *G06F 3/147* (2013.01); *G09G 3/20* (2013.01);
(Continued)

(58) Field of Classification Search
CPC .......... H02M 3/06; H02M 3/10; H02M 3/156; H02M 1/32; G01R 31/024; G06F 3/147; G09G 3/20; G09G 3/2092; G09G 3/3208; H02J 7/0047
See application file for complete search history.

(56) References Cited

U.S. PATENT DOCUMENTS 6,211,681 B1 *  4/2001  Kagawa ............... B60K 6/46
                                                    324/426
7,626,353 B2 * 12/2009  Kanouda ............... G06F 1/26
                                                     307/46
(Continued)

FOREIGN PATENT DOCUMENTS

KR   1020090131080 A   12/2009
KR   1020130102256 A    9/2013
(Continued)

*Primary Examiner* — Jue Zhang
*Assistant Examiner* — Kevin H Sprenger
(74) *Attorney, Agent, or Firm* — Cantor Colburn LLP

(57) ABSTRACT

A direct current to direct current converter includes a first voltage converting circuit which converts an input voltage into a first power supply voltage, a control block which stores information about voltage levels of a second power supply voltage, receives an external control signal, and generates a voltage level selection signal indicating a first one of the voltage levels, a second voltage converting circuit which converts the input voltage into the second power supply voltage having the first one indicated by the voltage level selection signal, and an abnormal state detector which detects an abnormal state of a display panel, and provides a current limit signal to the control block when the abnormal state is detected. In response to the current limit signal, the control block generates the voltage level selection signal indicating a second one of the voltage levels regardless of the external control signal.

20 Claims, 12 Drawing Sheets

(51) Int. Cl.
- *G06F 3/147* (2006.01)
- *G01R 31/02* (2006.01)
- *H02J 7/00* (2006.01)
- *H02M 1/32* (2007.01)
- *H02M 3/156* (2006.01)
- *G09G 3/20* (2006.01)
- *G09G 3/3208* (2016.01)
- *H02M 1/00* (2006.01)

(52) U.S. Cl.
CPC ......... *G09G 3/2092* (2013.01); *G09G 3/3208* (2013.01); *H02J 7/0047* (2013.01); *H02M 1/32* (2013.01); *H02M 3/10* (2013.01); *H02M 3/156* (2013.01); *G09G 2310/0278* (2013.01); *G09G 2330/028* (2013.01); *H02M 2001/008* (2013.01); *H02M 2001/325* (2013.01)

(56) References Cited

U.S. PATENT DOCUMENTS

| | | | |
|---|---|---|---|
| 2010/0270862 A1* | 10/2010 | Miyanaga | H01M 10/44 307/66 |
| 2012/0229110 A1* | 9/2012 | Huang | H02M 3/1582 323/282 |
| 2013/0154572 A1* | 6/2013 | Ito | B60L 3/0046 320/136 |
| 2014/0145504 A1* | 5/2014 | Kayama | H02J 7/0055 307/23 |
| 2015/0035359 A1* | 2/2015 | Chung | H02J 3/32 307/23 |

FOREIGN PATENT DOCUMENTS

| KR | 1020150048377 A | 5/2015 |
|---|---|---|
| KR | 1020160123452 A | 10/2016 |

\* cited by examiner

| NUMBER OF ABNORMAL STATE REFERENCE SETTING PULSES | ABNORMAL STATE REFERENCE CURRENT |
|---|---|
| | CURRENT LIMIT OFF |
| 0 | |
| 1 | 100 mA |
| 2 | 200 mA |
| 3 | 300 mA |
| 4 | 400 mA |
| 5 | 500 mA |
| 6 | 600 mA |
| 7 | 700 mA |

| NUMBER OF ABNORMAL STATE REFERENCE SETTING PULSES | VOLTAGE LEVEL OF EVLSS |
|---|---|
| 0 | DEFAULT |
| 1 | −7.6V |
| 2 | −7.5V |
| ⋮ | ⋮ |
| 61 | −1.6V |
| 62 | −1.5V |
| 63 | −1.4V |

160

DC-DC CONVERTER, AND DISPLAY DEVICE INCLUDING THE SAME

This application claims priority to Korean Patent Application No. 10-2017-0012134, filed on Jan. 25, 2017, and all the benefits accruing therefrom under 35 U.S.C. § 119, the content of which in its entirety is herein incorporated by reference.

BACKGROUND

1. Field

Exemplary embodiments of the invention relate to display devices, and more particularly to direct current to direct current ("DC-DC") converters and the display devices including the DC-DC converters.

2. Description of the Related Art

A display device includes a direct current to direct current ("DC-DC") converter that converts an input power supply voltage received from an external power source, such as a battery, into a high power supply voltage and a low power supply voltage suitable for driving a display panel. The DC-DC converter may have a protection function that stops supplying power to the display panel when a defect, such as a short circuit defect, occurs in the display panel or a peripheral circuit. By this protection function of the DC-DC converter, the display panel and the DC-DC converter are prevented from being damaged even when the defect occurs in the display panel.

SUMMARY

In a conventional display device, when a supply of power to a display panel is stopped, the display panel cannot display an image any longer.

Some exemplary embodiments provide a direct current to direct current ("DC-DC") converter that supplies power to a display panel even when the display panel is in an abnormal state, so that the display panel continuously displays an image in the abnormal state without damaging the display panel and the DC-DC converter.

Some exemplary embodiments provide a display device including a DC-DC converter that supplies power to a display panel even when the display panel is in an abnormal state, so that the display panel continuously displays an image in the abnormal state without damaging the display panel and the DC-DC converter.

According to an exemplary embodiment, there is provided a DC-DC converter for supplying a first power supply voltage and a second power supply voltage to a display panel. The DC-DC converter includes a first voltage converting circuit which converts an input voltage into the first power supply voltage, a control block which stores information about a plurality of voltage levels of the second power supply voltage, receives an external control signal, and generates a voltage level selection signal indicating a first one of the plurality of voltage levels corresponding to the external control signal, a second voltage converting circuit which converts the input voltage into the second power supply voltage having the first one of the plurality of voltage levels indicated by the voltage level selection signal, and an abnormal state detector which detects an abnormal state of the display panel, and to provide a current limit signal to the control block when the abnormal state is detected. In response to the current limit signal, the control block generates the voltage level selection signal indicating a second one of the plurality of voltage levels regardless of the external control signal such that the second voltage converting circuit forcibly changes the second power supply voltage from the first one of the plurality of voltage levels to the second one of the plurality of voltage levels.

In an exemplary embodiment, a voltage difference between the first power supply voltage and the second power supply voltage having the second one of the plurality of voltage levels may be less than a voltage difference between the first power supply voltage and the second power supply voltage having the first one of the plurality of voltage levels.

In an exemplary embodiment, the second one of the plurality of voltage levels may be a voltage level closest to a voltage level of the first power supply voltage among the plurality of voltage levels.

In an exemplary embodiment, the first power supply voltage may be a high power supply voltage having a fixed voltage level, the second power supply voltage may be a low power supply voltage, and the second one of the voltage levels may be a highest voltage level among the plurality of voltage levels of the low power supply voltage that are capable of being generated by the second voltage converting circuit.

In an exemplary embodiment, the abnormal state detector may detect a panel current flowing through the display panel, and may generate the current limit signal when the panel current exceeds an abnormal state reference current.

In an exemplary embodiment, the abnormal state detector may include a panel current detector which detects a panel current flowing through the display panel, and to generate a detection voltage corresponding to the panel current, an abnormal state reference generator which generates an abnormal state reference voltage corresponding to an abnormal state reference current, and a comparator which compares the detection voltage with the abnormal state reference voltage, and to generate the current limit signal when the detection voltage exceeds the abnormal state reference voltage.

In an exemplary embodiment, the external control signal may include abnormal state reference setting pulses. The control block further may store information about a plurality of current levels of the abnormal state reference current, and may generate, in response to the abnormal state reference setting pulses, an abnormal state reference selection signal indicating a current level corresponding to a number of the abnormal state reference setting pulses among the plurality of current levels. The abnormal state reference generator may generate the abnormal state reference voltage having a voltage level corresponding to the current level indicated by the abnormal state reference selection signal.

In an exemplary embodiment, the control block may include an abnormal state reference table storing the information about the plurality of current levels of the abnormal state reference current respectively corresponding to the number of the abnormal state reference setting pulses.

In an exemplary embodiment, the second voltage converting circuit may include a reference voltage generator which generates a reference voltage corresponding to the voltage level selection signal, and a voltage converting module which converts the input voltage into the second power supply voltage corresponding to the reference voltage.

In an exemplary embodiment, the external control signal may include power supply voltage setting pulses. The control block may generate, in response to the power supply voltage setting pulses, the voltage level selection signal indicating the first one of the plurality of voltage levels corresponding to a number of the power supply voltage setting pulses, and may generate, in response to the current limit signal, the voltage level selection signal indicating the second one of the plurality of voltage levels regardless of the number of the power supply voltage setting pulses. The reference voltage generator may generate the reference voltage having a voltage level corresponding to the first one of the plurality of voltage levels of the second power supply voltage in response to the voltage level selection signal indicating the first one of the plurality of voltage levels, and may change the voltage level of the reference voltage to another voltage level corresponding to the second one of the plurality of voltage levels of the second power supply voltage in response to the voltage level selection signal indicating the second one of the plurality of voltage levels.

In an exemplary embodiment, the control block may include a voltage level table storing the information about the plurality of voltage levels of the second power supply voltage respectively corresponding to the number of the power supply voltage setting pulses.

In an exemplary embodiment, when the second power supply voltage is changed from the first one of the plurality of voltage levels to the second one of the plurality of voltage levels, the second voltage converting circuit may gradually change the second power supply voltage from the first one of the plurality of voltage levels to the second one of the plurality of voltage levels during a predetermined time.

In an exemplary embodiment, the abnormal state detector may initiate a detecting operation for the abnormal state of the display panel in response to a detection enable signal. When the abnormal state is detected, the abnormal state detector may stop the detecting operation, may generate the current limit signal having a logic high level, and may maintain the current limit signal as the logic high level until a detection reset pulse is received. In response to the detection reset pulse, the abnormal state detector may resume the detecting operation, and changes the current limit signal to a logic low level.

In an exemplary embodiment, in response to the current limit signal having the logic low level, the control block may generate the voltage level selection signal indicating the first one of the plurality of voltage levels such that the second voltage converting circuit changes the second power supply voltage from the second one of the plurality of voltage levels to the first one of the plurality of voltage levels.

In an exemplary embodiment, when the abnormal state is detected, the abnormal state detector may stop a detecting operation, may generate the current limit signal having a logic high level, and may maintain the current limit signal as the logic high level until the DC-DC converter is powered off.

In an exemplary embodiment, the abnormal state detector may include a temperature sensor that detects a temperature. The abnormal state detector may generate the current limit signal when the detected temperature exceeds an abnormal state reference temperature.

According to an exemplary embodiment, there is provided a DC-DC converter for supplying a first power supply voltage and a second power supply voltage to a display panel. The DC-DC converter includes a first voltage converting circuit which converts an input voltage into the first power supply voltage, a control block which stores information about a plurality of voltage levels of the second power supply voltage, receives an external control signal, and generates a voltage level selection signal indicating a voltage level corresponding to the external control signal among the plurality of voltage levels, a second voltage converting circuit which converts the input voltage into the second power supply voltage having the voltage level indicated by the voltage level selection signal, and an abnormal state detector which detects an abnormal state of the display panel, and to provide a current limit signal to the control block when the abnormal state is detected. The control block turns off the second voltage converting circuit in response to the current limit signal.

In an exemplary embodiment, when the second voltage converting circuit is turned off, the DC-DC converter may supply a ground voltage as the second power supply voltage to the display panel.

In an exemplary embodiment, the first voltage converting circuit may maintain a voltage level of the first power supply voltage regardless of whether the second voltage converting circuit is turned off.

According to an exemplary embodiment, there is provided a display device including a display panel, and a DC-DC converter for supplying a first power supply voltage and a second power supply voltage to the display panel. The DC-DC converter includes a first voltage converting circuit which converts an input voltage into the first power supply voltage, a control block which stores information about a plurality of voltage levels of the second power supply voltage, receives an external control signal, and generates a voltage level selection signal indicating a first one of the plurality of voltage levels corresponding to the external control signal, a second voltage converting circuit which converts the input voltage into the second power supply voltage having the first one of the plurality of voltage levels indicated by the voltage level selection signal, and an abnormal state detector which detects an abnormal state of the display panel, and provides a current limit signal to the control block when the abnormal state is detected. In response to the current limit signal, the control block generates the voltage level selection signal indicating a second one of the plurality of voltage levels regardless of the external control signal such that the second voltage converting circuit forcibly changes the second power supply voltage from the first one of the plurality of voltage levels to the second one of the plurality of voltage levels.

As described above, the DC-DC converter and the display device including the DC-DC converter according to exemplary embodiments may detect the abnormal state of the display panel. When the abnormal state is detected, the DC-DC converter may maintain the voltage level of the first power supply voltage, and may forcibly change the voltage level of the second power supply voltage. Accordingly, even when the display panel is in the abnormal state, the display panel may continuously display an image while the display panel and the DC-DC converter are not damaged.

Further, the DC-DC converter and the display device including the DC-DC converter according to exemplary embodiments may use a circuit for changing the voltage level of the second power supply voltage in a normal state to forcibly change the voltage level of the second power supply voltage in the abnormal state. Accordingly, an addition of circuits may be minimized.

BRIEF DESCRIPTION OF THE DRAWINGS

Illustrative, non-limiting exemplary embodiments will be more clearly understood from the following detailed description in conjunction with the accompanying drawings.

FIG. 3 is a diagram illustrating an exemplary embodiment of an example of an abnormal state reference table included in a control block illustrated in FIG. 2.

DETAILED DESCRIPTION

Figure 1:
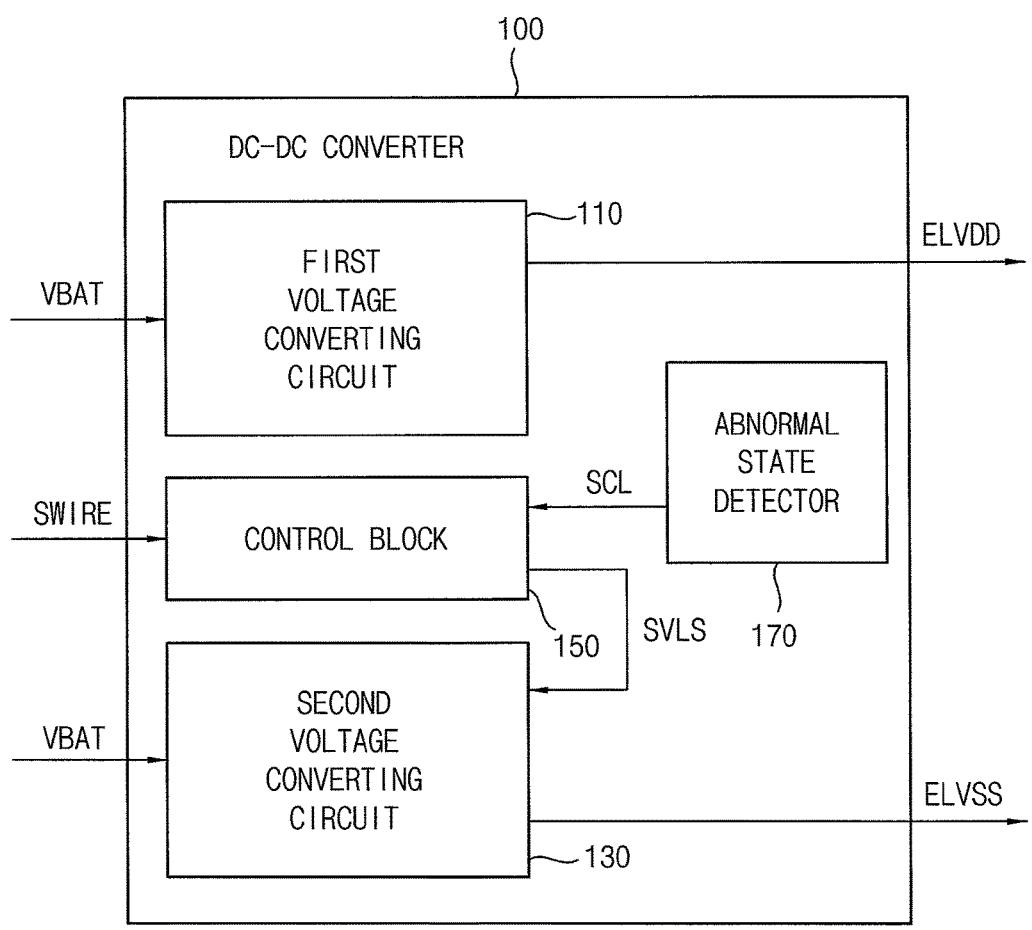
FIG. 1 is a block diagram illustrating a direct current to direct current ("DC-DC") converter.

Hereinafter, embodiments of the invention will be explained in detail with reference to the accompanying drawings. This invention may, however, be embodied in many different forms, and should not be construed as limited to the embodiments set forth herein. Rather, these embodiments are provided so that this invention will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an exemplary embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

FIG. 1 is a block diagram illustrating a direct current to direct current ("DC-DC") converter according to exemplary embodiments.

Referring to FIG. 1, a DC-DC converter 100 for supplying a first power supply voltage ELVDD and a second power supply voltage ELVSS to a display panel may include a first voltage converting circuit 110, a second voltage converting circuit 130, a control block 150 and an abnormal state detector 170.

The first voltage converting circuit 100 may convert an input voltage VBAT into the first power supply voltage ELVDD, and the second voltage converting circuit 130 may convert the input voltage VBAT into the second power supply voltage ELVSS. The input voltage VBAT may be an input power supply voltage received from an external power source. In an exemplary embodiment, the input voltage VBAT may be a battery voltage received from an external battery, for example. In some exemplary embodiments, the first power supply voltage ELVDD may be a high power supply voltage, and the second power supply voltage ELVSS may be a low power supply voltage. Further, in some exemplary embodiments, the display panel may be an organic light emitting diode ("OLED") display panel including OLEDs that emit light based on a voltage difference between the first power supply voltage ELVDD and the second power supply voltage ELVSS supplied from the DC-DC converter 100. In other exemplary embodiments, the display panel may be any display panel that desires the high and low power supply voltages.

The control block 150 may receive an external control signal SWIRE from an external circuit, such as a display driver. In some exemplary embodiments, the external control signal SWIRE may be a digital signal in accordance with a single-wire ("S-WIRE") protocol, for example. In other exemplary embodiments, the external control signal SWIRE may be a digital signal in accordance with an inter-integrated circuit ("I2C") communication protocol, for example. The control block 150 may be a digital block that receives and processes the digital signal. The control block 150 may control on/off of the DC-DC converter 100 in response to the external control signal SWIRE.

Further, the control block 150 may control a voltage level of the second power supply voltage ELVSS (e.g., the low power supply voltage) in response to the external control signal SWIRE. In some exemplary embodiments, the external control signal SWIRE may include power supply voltage setting pulses for setting the voltage level of the second power supply voltage ELVSS according to a battery voltage of an external battery, luminance of ambient light, an input image, and/or a temperature, and the control block 150 may set or adjust the voltage level of the second power supply voltage ELVSS in response to the power supply voltage setting pulses included in the external control signal SWIRE. In an exemplary embodiment, the control block 150 may store information about a plurality of voltage levels of the second power supply voltage ELVSS that are capable of being generated by the second voltage converting circuit 130, and may generate a voltage level selection signal SVLS indicating a first voltage level corresponding to (the number of power supply voltage setting pulses of) the external control signal among the stored plurality of voltage levels, for example. The second voltage converting circuit 130 may convert the input voltage VBAT into the second power supply voltage ELVSS having the first voltage level indicated by the voltage level selection signal SVLS. In this manner, the control block 150 may set the voltage level of the second power supply voltage ELVSS using the voltage level selection signal SVLS when the DC-DC converter 100 starts to operate, and may change the voltage level of the second power supply voltage ELVSS using the voltage level selection signal SVLS while the DC-DC converter 100 operates.

The abnormal state detector 170 may detect an abnormal state of the display panel. In some exemplary embodiments, the abnormal state detector 170 may detect a panel current flowing through the display panel, and may determine that the display panel is in the abnormal state when the panel current exceeds an abnormal state reference current. In an exemplary embodiment, in a case where a defect, such as a short circuit defect, occurs in the display panel or a peripheral circuit of the display panel, the panel current flowing through the display panel may increase, and the abnormal state detector 170 may determine that the display panel is in the abnormal state by detecting the increase of the panel current, for example. In other exemplary embodiments, the abnormal state detector 170 may detect a temperature, and may determine that the display panel is in the abnormal state when the detected temperature exceeds an abnormal state reference temperature.

When the abnormal state of the display panel is detected, the abnormal state detector 170 may provide a current limit signal SCL to the control block 150. In response to the current limit signal SCL, the control block 150 may generate the voltage level selection signal SVLS indicating a (predetermined) second voltage level regardless of the external control signal SWIRE among the plurality of voltage levels of the second power supply voltage ELVSS that are capable of being generated by the second voltage converting circuit 130, so that the second voltage converting circuit 130 forcibly may change the second power supply voltage ELVSS from the first voltage level set by the external control signal SWIRE to the second voltage level. A voltage difference between the first power supply voltage ELVDD and the second power supply voltage ELVSS having the forcibly changed second voltage level may be reduced compared with a voltage difference between the first power supply voltage ELVDD and the second power supply voltage ELVSS having the first voltage level set by the external control signal SWIRE. Accordingly, the display panel may be supplied with the first and second power supply voltages ELVDD and ELVSS having the reduced voltage difference, and the panel current flowing through the display panel based on the first and second power supply voltages ELVDD and ELVSS may be reduced. In some exemplary embodiments, the second voltage level to which the second power supply voltage ELVSS is forcibly changed in response to the current limit signal SCL may be a voltage level closest to a voltage level of the first power supply voltage ELVDD among the plurality of voltage levels stored in the control block 150. In an exemplary embodiment, the first power supply voltage ELVDD may be a high power supply voltage having a fixed voltage level, the second power supply voltage ELVSS may be a low power supply voltage, and the second voltage levels may be a highest voltage level among the plurality of voltage levels of the low power supply voltage ELVSS that are capable of being generated by the second voltage converting circuit 130, for example.

When the defect, such as a short circuit defect, occurs in a display panel or a peripheral circuit of the display panel, a conventional DC-DC converter may stop supplying power to the display panel. Accordingly, a display device including the conventional DC-DC converter cannot display an image any more when the defect occurs. This stop of the image display may be a big problem in a situation where it is desired to continuously display the image, such as a situation where the display panel displays driving information of a vehicle. However, the DC-DC converter 100 according to exemplary embodiments may detect the abnormal state of the display panel, and, when the abnormal state is detected, may forcibly change the voltage level of the second power supply voltage ELVSS while maintaining the voltage level of the first power supply voltage ELVDD such that the voltage difference between the first power supply voltage ELVDD and the second power supply voltage ELVSS is reduced. Accordingly, in the display device including the DC-DC converter 100 according to exemplary embodiments, even when the defect occurs, the display panel may continuously display the image while the display panel and the DC-DC converter 100 may not be damaged because the panel current flowing through the display panel is reduced.

Figure 2:
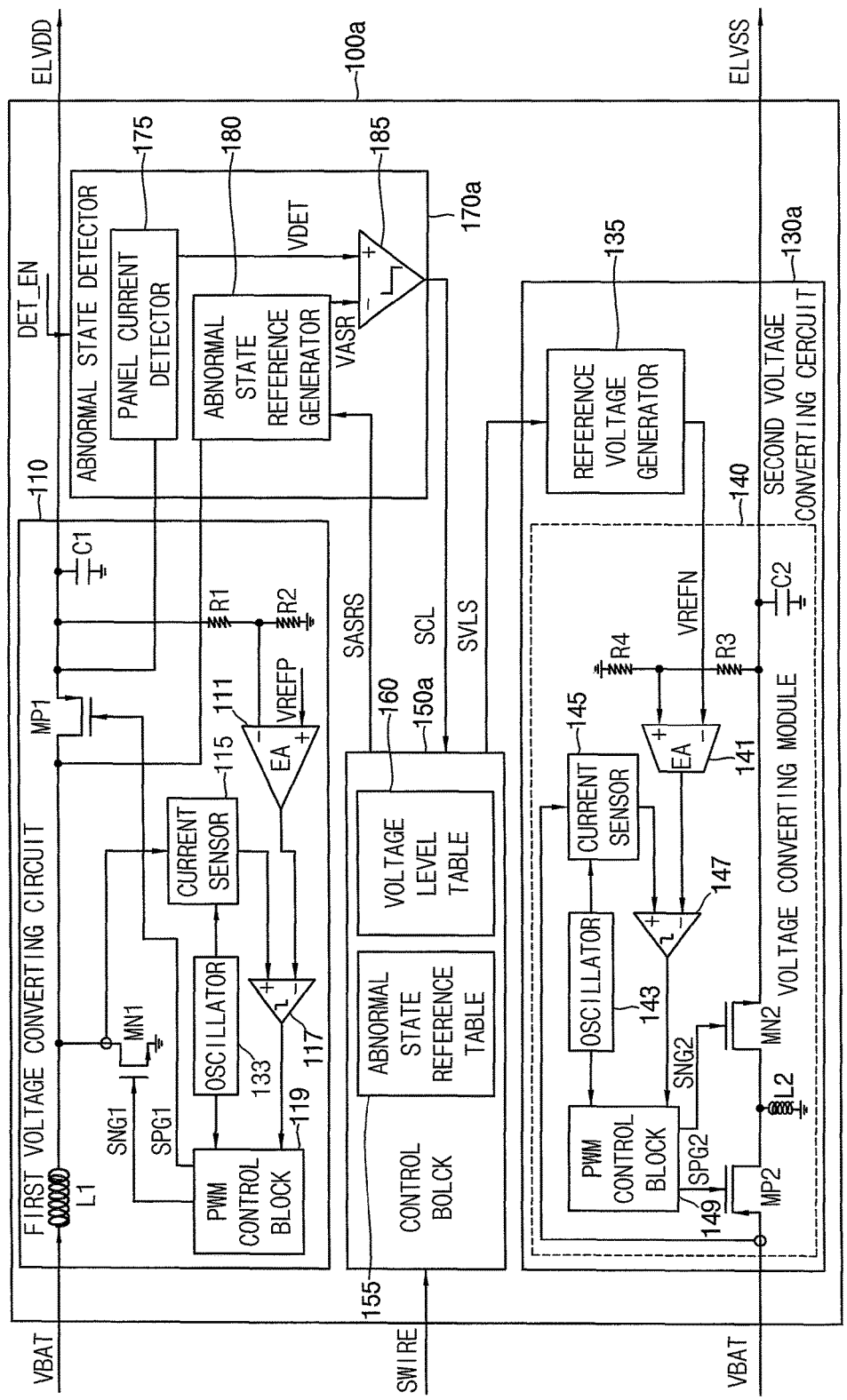
FIG. 2 is a block diagram illustrating an exemplary embodiment of a DC-DC converter.
Figure 4:
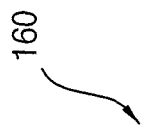
FIG. 4 is a diagram illustrating an exemplary embodiment of an example of a voltage level table included in a control block illustrated in FIG. 2.

FIG. 2 is a block diagram illustrating a DC-DC converter according to exemplary embodiments, FIG. 3 is a diagram illustrating an example of an abnormal state reference table included in a control block illustrated in FIG. 2, and FIG. 4 is a diagram illustrating an example of a voltage level table included in a control block illustrated in FIG. 2.

Referring to FIG. 2, a DC-DC converter 100a for supplying first and second power supply voltages ELVDD and ELVSS to a display panel may include a first voltage converting circuit 110 that converts an input voltage VBAT into the first power supply voltage ELVDD, a second voltage converting circuit 130a that converts the input voltage VBAT into the second power supply voltage ELVSS, a control block 150a that controls a voltage level of the second power supply voltage ELVSS in response to an external control signal SWIRE, and an abnormal state detector 170a that detects an abnormal state of the display panel.

The first voltage converting circuit 110 may convert the input voltage VBAT into a high power supply voltage as the first power supply voltage ELVDD. In an exemplary embodiment, the first voltage converting circuit 110 may be a boost converter that converts the input voltage VBAT into the high power supply voltage, for example. In some exemplary embodiments, the first voltage converting circuit 110 may include a first inductor L1, a first capacitor C1, a first N-type metal-oxide-semiconductor ("NMOS") transistor MN1, a first P-type metal-oxide-semiconductor ("PMOS") transistor MP1, a voltage divider R1 and R2, an error amplifier 111, an oscillator 133, a current sensor 115, a comparator 117 and a pulse width modulation ("PWM") control block 119.

The voltage divider R1 and R2 may include first and second resistors R1 and R2, and may generate a feedback voltage by dividing the first power supply voltage ELVDD. The error amplifier 111 may amplify and output a voltage difference between the feedback voltage and a reference voltage VREFP. The oscillator 133 may provide a clock signal to the PWM control block 119, and may provide a ramp signal to the current sensor 115. The current sensor 115 may sense a current flowing through the first NMOS transistor MN1, and may output a synthesized signal by synthesizing a current sense signal and the ramp signal. The comparator 117 may compare an output of the current sensor 115 and an output of the error amplifier 111. The PWM control block 119 may generate first and second switching signals SNG1 and SPG1 of which a pulse width or a duty cycle is adjusted in response to an output of the comparator 117. The first NMOS transistor MN1 and the first PMOS transistor MP1 may be turned on in response to the first and second switching signals SNG1 and SPG1, respectively. The PWM control block 119 may generate the first and second switching signals SNG1 and SPG1 such that the first NMOS transistor MN1 and the first PMOS transistor MP1 are alternately turned on. An energy may be accumulated in the first inductor L1 while the first NMOS transistor MN1 is turned on, the energy accumulated in the first inductor L1 may be transferred to the first capacitor C1 while the first PMOS transistor MP1 is turned on, and thus the input voltage VBAT may be converted into the first power supply voltage ELVDD.

In some exemplary embodiments, a portion of components of the first voltage converting circuit 110 may be located outside an integrated circuit where the DC-DC converter 100a is implemented. In an exemplary embodiment, the first inductor L1 and the first capacitor C1 of the first voltage converting circuit 110 may be implemented as external passive elements located outside the integrated circuit, for example. Further, although FIG. 2 illustrates an example of a configuration of the first voltage converting circuit 110, the first voltage converting circuit 110 included in the DC-DC converter 100a according to exemplary embodiments may not be limited to the illustrated configuration, and may have any configuration that converts the input voltage VBAT into the first power supply voltage ELVDD.

The second voltage converting circuit 130a may convert the input voltage VBAT into a low power supply voltage as the second power supply voltage ELVSS. In an exemplary embodiment, the second voltage converting circuit 130a may be an inverting buck-boost converter that converts the input voltage VBAT into the low power supply voltage, for example. In some exemplary embodiments, the second voltage converting circuit 130a may include a reference voltage generator 135 that generates a reference voltage VREFN, and a voltage converting module 140 that converts the input voltage VBAT into the second power supply voltage ELVSS corresponding to the reference voltage VREFN. The voltage converting module 140 may include a second inductor L2, a second capacitor C2, a second PMOS transistor MP2, a second NMOS transistor MN2, a voltage divider R3 and R4, an error amplifier 141, an oscillator 143, a current sensor 145, a comparator 147 and a PWM control block 149.

The voltage divider R3 and R4 may include third and fourth resistors R3 and R4, and may generate a feedback voltage by dividing the second power supply voltage ELVSS. The error amplifier 141 may amplify and output a voltage difference between the feedback voltage and a reference voltage VREFN. The oscillator 143 may provide a clock signal to the PWM control block 149, and may provide a ramp signal to the current sensor 145. The current sensor 145 may sense a current flowing through the second PMOS transistor MP2, and may output a synthesized signal by synthesizing a current sense signal and the ramp signal. The comparator 147 may compare an output of the current sensor 145 and an output of the error amplifier 141. The PWM control block 149 may generate third and fourth switching signals SPG2 and SNG2 of which a pulse width or a duty cycle is adjusted in response to an output of the comparator 147. The second PMOS transistor MP2 and the second NMOS transistor MN2 may be turned on in response to the third and fourth switching signals SPG2 and SNG2, respectively. The PWM control block 149 may generate the third and fourth switching signals SPG2 and SNG2 such that the second PMOS transistor MP2 and the second NMOS transistor MN2 are alternately turned on. An energy may be accumulated in the second inductor L2 while the second PMOS transistor MP2 is turned on, the energy accumulated in the second inductor L2 may be transferred to the second capacitor C2 while the second NMOS transistor MP2 is turned on, and thus the input voltage VBAT may be converted into the second power supply voltage ELVSS.

In some exemplary embodiments, a portion of components of the second voltage converting circuit 130a may be located outside the integrated circuit where the DC-DC converter 100a is implemented. In an exemplary embodiment, the second inductor L2 and the second capacitor C2 of the second voltage converting circuit 130a may be implemented as external passive elements located outside the integrated circuit, for example. Further, although FIG. 2 illustrates an example of a configuration of the second voltage converting circuit 130a, the second voltage converting circuit 130a included in the DC-DC converter 100a according to exemplary embodiments may not be limited to the illustrated configuration, and may have any configuration that converts the input voltage VBAT into the second power supply voltage ELVSS.

The control block 150a may control the voltage level of the second power supply voltage ELVSS (e.g., a low power supply voltage) in response to an external control signal SWIRE. In some exemplary embodiments, the control block 150a may store information about a plurality of voltage levels of the second power supply voltage ELVSS, the external control signal SWIRE may include power supply voltage setting pulses, and the control block 150a may generate a voltage level selection signal SVLS indicating a first voltage level corresponding to the number of the power supply voltage setting pulses among the stored plurality of voltage levels in response to the power supply voltage setting pulses included in the external control signal SWIRE. The second voltage converting circuit 130a may convert the input voltage VBAT into the second power supply voltage ELVSS having the first voltage level indicated by the voltage level selection signal SVLS in response to the voltage level selection signal SVLS indicating the first voltage level. In some exemplary embodiments, the reference voltage generator 135 of the second voltage converting circuit 130a may generate the reference voltage VREFN having a voltage level corresponding to the first voltage level of the second power supply voltage ELVSS in response to the voltage level selection signal SVLS indicating the first voltage level, and the voltage converting module 140 of the second voltage converting circuit 130a may convert the input voltage VBAT into the second power supply voltage ELVSS having the first voltage level based on the reference voltage VREFN. That is, the second voltage converting circuit 130a may change the voltage level of the second power supply voltage ELVSS by changing the voltage level of the reference voltage VREFN in response to the voltage level selection signal SVLS.

The abnormal state detector 170a may detect a panel current flowing through the display panel, and may generate a current limit signal SCL when the panel current exceeds an abnormal state reference current. In some exemplary embodiments, the abnormal state detector 170a may include a panel current detector 175, an abnormal state reference generator 180 and a comparator 185.

The panel current detector 175 may detect the panel current flowing through the display panel, and may generate a detection voltage VDET corresponding to the panel current. In some exemplary embodiments, as illustrated in FIG. 2, the panel current detector 175 may be coupled to the first PMOS transistor MP1 to detect the panel current applied to the display panel through a line for supplying the first power supply voltage ELVDD. In other exemplary embodiments, the panel current detector 175 may detect the panel current output from the display panel through a line for supplying the second power supply voltage ELVSS.

The abnormal state reference generator 180 may generate an abnormal state reference voltage VASR corresponding to the abnormal state reference current. In some exemplary embodiments, the abnormal state reference generator 180 may receive an abnormal state reference selection signal SASRS indicating a voltage level of the abnormal state reference current from the control block 150a, and may generate the abnormal state reference voltage VASR having a voltage level corresponding to the current level indicated by the abnormal state reference selection signal SASRS. In an exemplary embodiment, the control block 150a may further store information about a plurality of current levels of the abnormal state reference current, the external control signal may include abnormal state reference setting pulses, and the control block 150a may generate, in response to the abnormal state reference setting pulses included in the external control signal SWIRE, the abnormal state reference selection signal SASRS indicating a current level corresponding to the number of the abnormal state reference setting pulses among the store plurality of current levels, for example. The abnormal state reference generator 180 may generate, in response to the abnormal state reference selection signal SASRS, the abnormal state reference voltage VASR having a voltage level corresponding to the current level indicated by the abnormal state reference selection signal SASRS.

In some exemplary embodiments, the control block 150a may store the information about the plurality of current levels of the abnormal state reference current in a form of a table. In an exemplary embodiment, the control block 150a may include an abnormal state reference table 155 for storing the information about the plurality of current levels of the abnormal state reference current, for example. As illustrated in FIG. 3, the abnormal state reference table 155 may store the information about the plurality of current levels respectively corresponding to the number of the abnormal state reference setting pulses. In an exemplary embodiment, the control block 150a including the abnormal state reference table 155 of FIG. 3 may generate the abnormal state reference selection signal SASRS indicating 100 milliampere (mA) as the current level of the abnormal state reference current when the number of the abnormal state reference setting pulses included in the external control signal SWIRE is 1, may generate the abnormal state reference selection signal SASRS indicating 200 mA as the current level of the abnormal state reference current when the number of the abnormal state reference setting pulses included in the external control signal SWIRE is 2, may generate the abnormal state reference selection signal SASRS indicating 300 mA as the current level of the abnormal state reference current when the number of the abnormal state reference setting pulses included in the external control signal SWIRE is 3, may generate the abnormal state reference selection signal SASRS indicating 400 mA as the current level of the abnormal state reference current when the number of the abnormal state reference setting pulses included in the external control signal SWIRE is 4, may generate the abnormal state reference selection signal SASRS indicating 500 mA as the current level of the abnormal state reference current when the number of the abnormal state reference setting pulses included in the external control signal SWIRE is 5, may generate the abnormal state reference selection signal SASRS indicating 600 mA as the current level of the abnormal state reference current when the number of the abnormal state reference setting pulses included in the external control signal SWIRE is 6, and may generate the abnormal state reference selection signal SASRS indicating 700 mA as the current level of the abnormal state reference current when the number of the abnormal state reference setting pulses included in the external control signal SWIRE is 7, for example. The abnormal state reference generator 180 may generate the abnormal state reference voltage VASR having a voltage level corresponding to the current level of 100 mA, 200 mA, 300 mA, 400 mA, 500 mA or 700 mA indicated by the abnormal state reference selection signal SASRS, for example. When the number of the abnormal state reference setting pulses included in the external control signal SWIRE is 0, the control block 150a may not activate the abnormal state detector 170a.

The comparator 185 may compare the detection voltage VDET from the panel current detector 175 with the abnormal state reference voltage VASR from the abnormal state reference generator 180, and may generate the current limit signal SCL indicating the abnormal state of the display panel when the detection voltage DET exceeds the abnormal state reference voltage VASR. In response to the current limit signal SCL, the control block 150a may generate the voltage level selection signal SVLS having not the first voltage level corresponding to the number of the power supply voltage setting pulses included in the external control signal SWIRE but the second voltage level regardless of the number of the power supply voltage setting pulses. In some exemplary embodiments, the second voltage level indicated by the voltage level selection signal SVLS generated in response to the current limit signal SCL may be the closest voltage level to the voltage level of the first power supply voltage ELVDD, or the highest voltage level among the stored plurality of voltage levels of the second power supply voltage ELVSS.

In some exemplary embodiments, the control block 150a may store the information about the plurality of voltage levels of the second power supply voltage ELVSS in a form of a table. In an exemplary embodiment, the control block 150a may include a voltage level table 160 for storing the information about the plurality of voltage levels of the second power supply voltage ELVSS, for example. As illustrated in FIG. 4, the voltage level table 160 may store the information about the plurality of voltage levels respectively corresponding to the number of the power supply voltage setting pulses. In an exemplary embodiment, the control block 150a including the voltage level table 160 of FIG. 4 may generate the voltage level selection signal SVLS indicating −7.6 volts (V) as the voltage level of the second power supply voltage ELVSS when the number of the power supply voltage setting pulses included in the external control signal SWIRE is 1, may generate the voltage level selection signal SVLS indicating −7.5 V as the voltage level of the second power supply voltage ELVSS when the number of the power supply voltage setting pulses included in the external control signal SWIRE is 2, may generate the voltage level selection signal SVLS indicating −1.6 V as the voltage level of the second power supply voltage ELVSS when the number of the power supply voltage setting pulses included in the external control signal SWIRE is 61, may generate the voltage level selection signal SVLS indicating −1.5 V as the voltage level of the second power supply voltage ELVSS when the number of the power supply voltage setting pulses included in the external control signal SWIRE is 62, and may generate the voltage level selection signal SVLS indicating −1.4 V as the voltage level of the second power supply voltage ELVSS when the number of the power supply voltage setting pulses included in the external control signal SWIRE is 6, for example. The second voltage converting circuit 130a may set or change the second power supply voltage ELVSS to the voltage level ranging from −7.4 V to −1.4 V indicated by the voltage level selection signal SVLS. When the number of the power supply voltage setting pulses included in the external control signal SWIRE is 0, the control block 150a may generate the voltage level selection signal SVLS indicating a default voltage level, for example about −4.5 V. Further, in response to the current limit signal SCL, the control block 150a including the voltage level table 160 of FIG. 4 may generate the voltage level selection signal SVLS indicating the highest voltage level, or −1.4 V among the plurality of voltage levels stored in the voltage level table 160, or −7.6 V through −1.4 V. The reference voltage generator 135 of the second voltage converting circuit 130a may generate the reference voltage VREFN having a voltage level corresponding to the second power supply voltage ELVSS of −1.4 V in response to the voltage level selection signal SVLS indicating −1.4 V, and the voltage converting module 140 of the second voltage converting circuit 130a may convert the input voltage VBAT into the second power supply voltage ELVSS of −1.4 V based on the reference voltage VREFN. Accordingly, a voltage difference between the first power supply voltage ELVDD and the second power supply voltage ELVSS may be reduced, and the panel current flowing through the display panel may be reduced according to the reduction of the voltage difference. Thus, even when the abnormal state of the display panel occurs, the display panel and the DC-DC converter 100a may be prevented from being damaged. Further, since the supply of power to the display panel is not stopped, and the display panel is continuously supplied with the first power supply voltage ELVDD and the second power supply voltage ELVSS, the display panel may continuously display an image even when the defect or the abnormal state of the display panel occurs.

In some exemplary embodiments, when the second power supply voltage ELVSS is changed from the first voltage level to the second voltage level in response to the current limit signal SCL, the second power converting circuit 130a may gradually change the second power supply voltage ELVSS during a predetermined time. In an example, to gradually change the second power supply voltage ELVSS, the reference voltage generator 135 of the second power converting circuit 130a may gradually change the reference voltage VREFN during the predetermined time in response to the voltage level selection signal SVLS indicating the second voltage level. In another example, to gradually change the second power supply voltage ELVSS, the control block 150a may gradually change the voltage level indicated by the voltage level selection signal SVLS during the predetermined time in response to the current limit signal SCL.

If the abnormal state detector 170a detects the abnormal state of the display panel (or that the panel current exceeds the abnormal state reference current), and generates the current limit signal SCL, the abnormal state detector 170a may maintain the current limit signal SCL during a predetermined time or until the DC-DC converter 100a is turned off.

In some exemplary embodiments, the abnormal state detector 170a may receive a detection enable signal DET_EN from the control block 150a (or another internal or external circuit), and may initiate a detecting operation for the abnormal state of the display panel in response to the detection enable signal DET_EN. When the abnormal state is detected, the abnormal state detector 170a may stop the detecting operation, and may generate the current limit signal SCL having a logic high level. The control block 150a may receive the current limit signal SCL, and, after a predetermined time from a time point of reception of the current limit signal SCL, may transfer the detection enable signal DET_EN including a detection reset pulse. The abnormal state detector 170a may maintain the current limit signal SCL as the logic high level until the detection reset pulse included in the detection enable signal DET_EN is received. In response to the detection reset pulse, the abnormal state detector 170a may resume the detecting operation, and may change the current limit signal SCL to a logic low level. In response to the current limit signal SCL having the logic low level, the control block 150a may change the voltage level of the voltage level selection signal SVLS from the second voltage level (e.g., the highest voltage level) to the first voltage level (e.g., the voltage level that is previously indicated by the voltage level selection signal SVLS before the current limit signal SCL having the logic high level is received). In response to the voltage level selection signal SVLS indicating the first voltage level, the second voltage converting circuit 130a may change the second power supply voltage ELVSS from the second voltage level to the first voltage level.

In other exemplary embodiments, when the abnormal state is detected, the abnormal state detector 170a may stop the detecting operation, may generate the current limit signal SCL indicating the logic high level, and may maintain the current limit signal SCL as the logic high level until the DC-DC converter 100a is turned off in response to the external control signal SWIRE.

Figure 5:
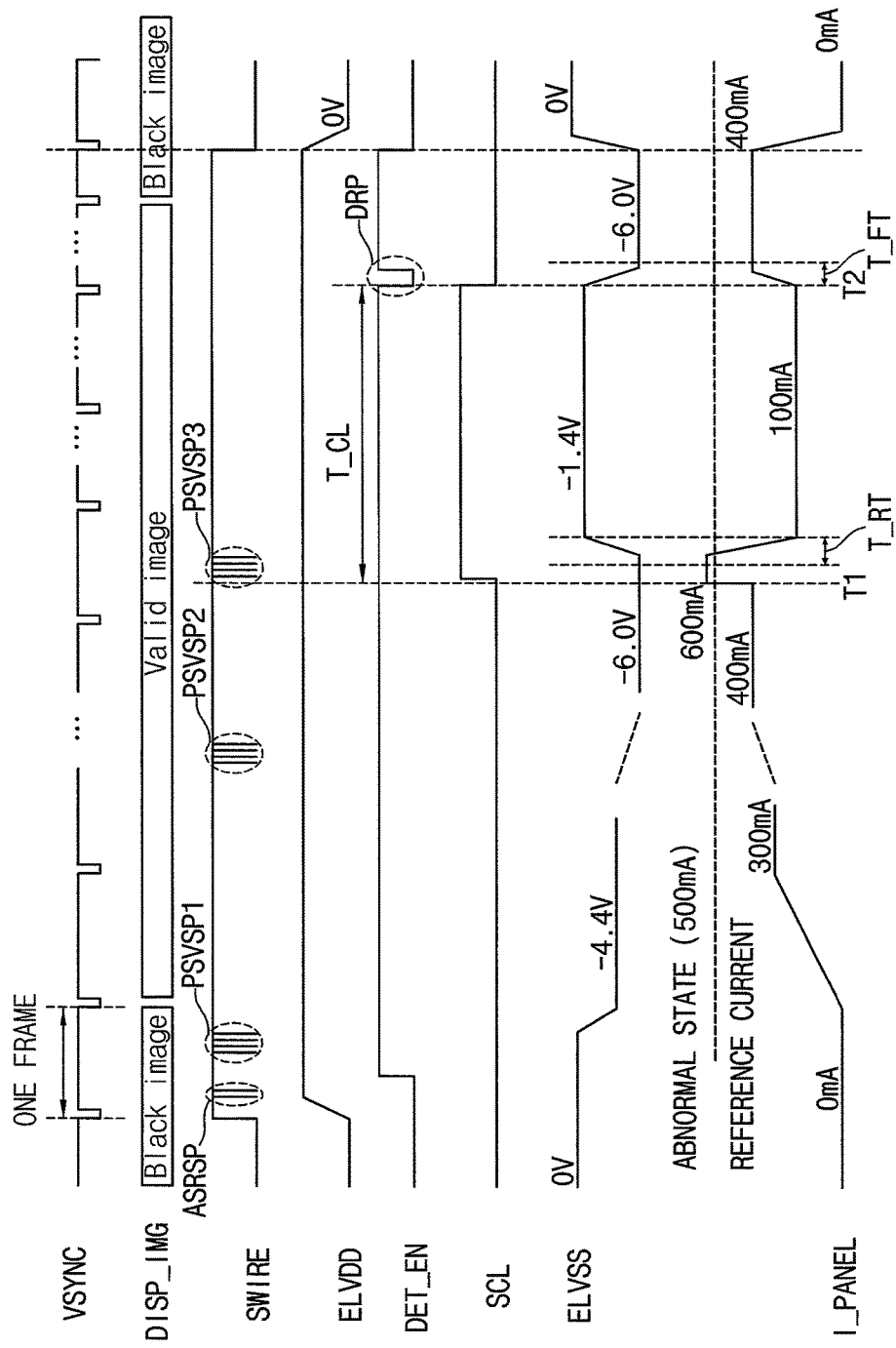
FIG. 5 is a timing diagram for describing an example of an operation of an exemplary embodiment of a DC-DC converter of FIG. 2.

FIG. 5 is a timing diagram for describing an example of an operation of a DC-DC converter of FIG. 2 according to exemplary embodiments.

In FIG. 5, VSYNC represents a vertical synchronization signal, and DISP_IMAGE represents an image displayed by a display panel. Referring to FIGS. 2 and 5, the DC-DC converter 100a may be activated or enabled in response to the external control signal SWIRE having a logic high level. The control block 150a may activate the first voltage converting circuit 110 in response to the external control signal SWIRE having the logic high level, and the activated first voltage converting circuit 110 may convert the input voltage VBAT into the first power supply voltage ELVDD, or the high power supply voltage.

In some exemplary embodiments, during a period of activation or ON of the DC-DC converter 100a, the external control signal SWIRE may include abnormal state reference setting pulses ASRSP. In an exemplary embodiment, the external control signal SWIRE may include five abnormal state reference setting pulses ASRSP, and the control block 150a may provide an abnormal state reference selection signal SASRS indicating 500 mA to an abnormal state detector 170a with reference to an abnormal state reference table 155 of FIG. 3, for example. Further, the control block 150a may provide a detection enable signal DET_EN having a logic high level to the abnormal state detector 170a. In response to the abnormal state reference selection signal SASRS indicating 500 mA and the detection enable signal DET_EN having the logic high level, the abnormal state detector 170a may determine whether a panel current of the display panel exceeds an abnormal state reference current of 500 mA.

In some exemplary embodiments, during the period of activation or ON of the DC-DC converter 100a, the external control signal SWIRE may further include first power supply voltage setting pulses PSVSP1. In an exemplary embodiment, the external control signal SWIRE may include thirty-three first power supply voltage setting pulses PSVSP1, and the control block 150a may provide a voltage level selection signal SVLS indicating −4.4 V to a second voltage converting circuit 130a with reference to a voltage level table 160 of FIG. 4, for example. In response to the voltage level selection signal SVLS indicating −4.4 V, the second voltage converting circuit 130a may convert the input voltage VBAT into a second power supply voltage ELVSS of −4.4 V.

The display panel may display a block image during the period of ON of the DC-DC converter 100a. After the activation or ON of the DC-DC converter 100a is completed, and the first power supply voltage ELVDD and the second power supply voltage ELVSS of −4.4 V are supplied, the display panel may display a valid image.

While a display device normally operates, a display driver included in the display device may provide the external control signal SWIRE including second power supply voltage setting pulses PSVSP2 to the control block 150a such that the voltage level of the second power supply voltage ELVSS may be changed according to a battery voltage of an external battery, luminance of ambient light, an input image, and/or a temperature. In an exemplary embodiment, the external control signal SWIRE may include seven-teen second power supply voltage setting pulses PSVSP2, and the control block 150a may provide the voltage level selection signal SVLS indicating −6.0 V to the second voltage converting circuit 130a with reference to the voltage level table 160 of FIG. 4, for example. In response to the voltage level selection signal SVLS indicating −6.0 V, the second voltage converting circuit 130a may convert the input voltage VBAT into the second power supply voltage ELVSS of −6.0 V. When the second power supply voltage ELVSS is reduced from −4.4 V to −6.0 V, and a voltage difference between the first power supply voltage ELVDD and the second power supply voltage ELVSS is increased, the panel current flowing through the display panel may be increased from about 300 mA to about 400 mA.

At a first time point T1, when a defect, such as a short circuit defect, occurs in the display panel or its peripheral circuit, the panel current of the display panel may be increased. In an exemplary embodiment, the panel current of the display panel may be increased to 600 mA, which exceeds the abnormal state reference current of 500 mA, for example. The abnormal state detector 170a may detect that the panel current of the display panel exceeds the abnormal state reference current, and may provide the current limit signal SCL having a logic high level to the control block 150a. In response to the current limit signal SCL having the logic high level, the control block 150a may provide the voltage level selection signal SVLS indicating the highest voltage level in the voltage level table 160 of FIG. 4, or −1.4 V to the second voltage converting circuit 130a regardless of the number of the second power supply voltage setting pulses PSVSP2 of the external control signal SWIRE. Further, once the control block 150a receives the current limit signal SCL having the logic high level, the control block 150a may not change the voltage level indicated by voltage level selection signal SVLS even when the external control signal SWIRE including third power supply voltage setting pulses PSVSP3 is received. That is, once the current limit signal SCL is received, the control block 150a may forcibly generate the voltage level selection signal SVLS indicating the highest voltage level, or −1.4 V regardless of the power supply voltage setting pulses PSVSP2 and PSVSP3. In response to the voltage level selection signal SVLS indicating −1.4 V, the second voltage converting circuit 130a may convert the input voltage VBAT into the second power supply voltage ELVSS of −1.4 V. That is, the second voltage converting circuit 130a may increase the second power supply voltage ELVSS from −6.0 V to −1.4 V in response to the voltage level selection signal SVLS indicating −1.4 V. In some exemplary embodiments, as illustrated in FIG. 5, the second voltage converting circuit 130a may gradually change the second power supply voltage ELVSS from −6.0 V to −1.4 V with a predetermined slope during a predetermined time T_RT. When the second power supply voltage ELVSS is increased from −6.0 V to −1.4 V, and the voltage difference between the first power supply voltage ELVDD and the second power supply voltage ELVSS is reduced, the panel current flowing through the display panel may be reduced, for example from 600 mA to 100 mA. Accordingly, even when the abnormal state of the display panel occurs, the panel current may be reduced, and thus the display panel and the DC-DC converter 100a may be prevented from being damaged. In addition, even when the abnormal state of the display panel occurs, the display panel may be continuously supplied with the first power supply voltage ELVDD and the second power supply voltage ELVSS, and thus the display panel may display the valid image.

Once the abnormal state is detected, the abnormal state detector 170a may stop the detecting operation, and may maintain the current limit signal SCL as the logic high level. In some exemplary embodiments, the abnormal state detector 170a may maintain the current limit signal SCL as the logic high level until a detection reset pulse DRP included in the detection enable signal DET_EN is received. The control block 150a may provide detection enable signal DET_EN including the detection reset pulse DRP to the abnormal state detector 170a after a predetermined time T_CL from the time point T1 of reception of the current limit signal SCL. At a second time point T2 after the predetermined time T_CL from the time point T1 of detection of the abnormal state, the abnormal state detector 170a may receive the detection enable signal DET_EN including the detection reset pulse DRP, and may change the current limit signal SCL to a logic low level in response to the detection reset pulse DRP included in the detection enable signal DET_EN. In response to the current limit signal SCL having the logic low level, the control block 150a may change the voltage level indicated by the voltage level selection signal SVLS from the highest voltage level, or 1.4 V to the voltage level before the time point T1 of detection of the abnormal state, or −6.0 V. In response to the voltage level selection signal SVLS indicating −6.0 V, the second voltage converting circuit 130a may increase the second power supply voltage ELVSS from −1.4 V to −6.0 V. In some exemplary embodiments, as illustrated in FIG. 5, the second voltage converting circuit 130a may gradually change the second power supply voltage ELVSS from −1.4 V to −6.0 V with a predetermined slope during a predetermined time T_FT. In response to the detection reset pulse DRP of the detection enable signal DET_EN, the abnormal state detector 170a may resume the detecting operation for the abnormal state of the display panel.

If the external control signal SWIRE having a logic low level is applied, the control block 150a may turn off the DC-DC converter 100a.

Figure 6:
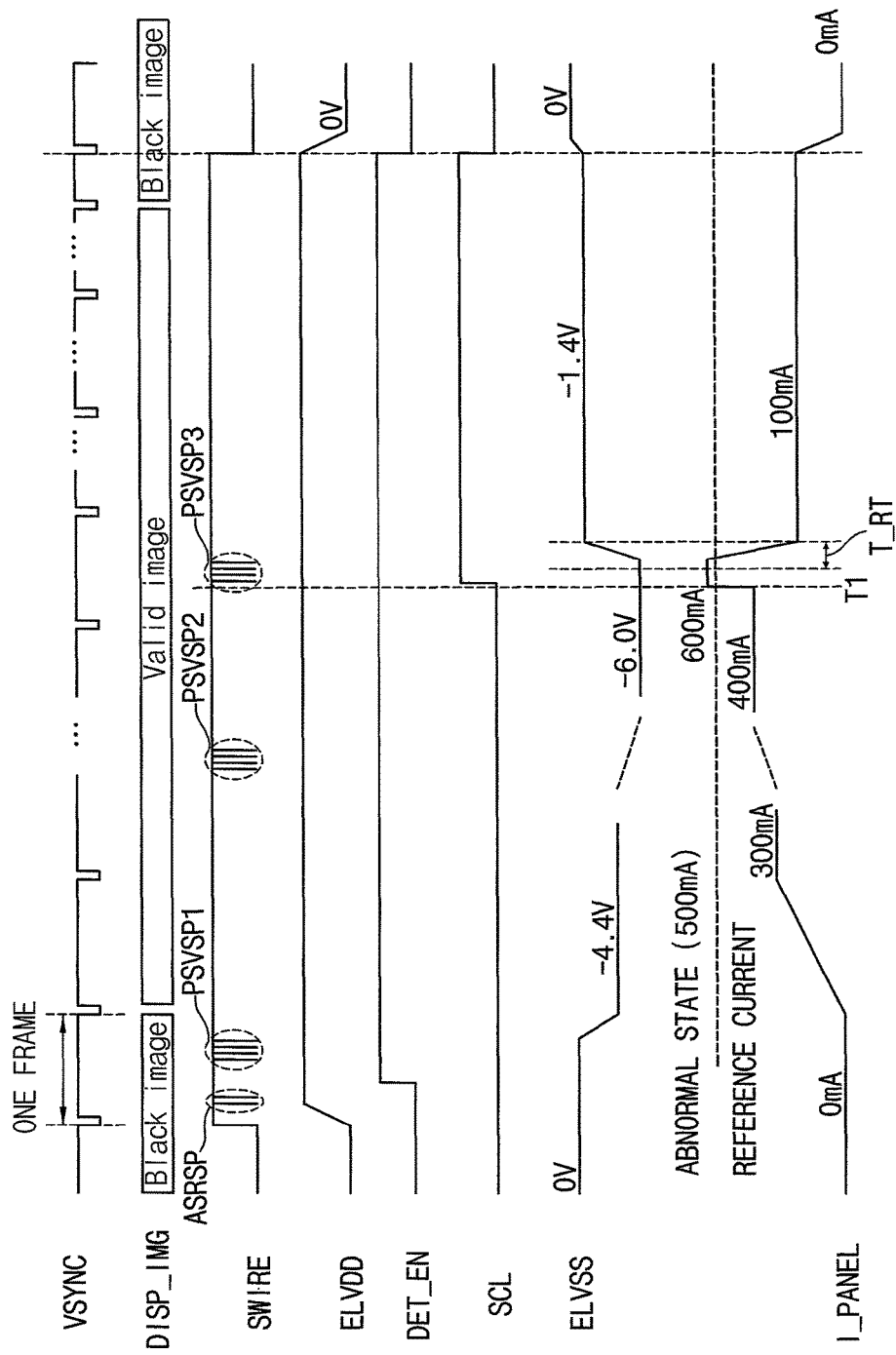
FIG. 6 is a timing diagram for describing another example of an operation of an exemplary embodiment of a DC-DC converter of FIG. 2.

FIG. 6 is a timing diagram for describing another example of an operation of a DC-DC converter of FIG. 2 according to exemplary embodiments.

Referring to FIGS. 2 and 6, a DC-DC converter 100a performing an operation illustrated in a timing diagram of FIG. 6 may perform substantially the same operation as the DC-DC converter 100a performing an operation illustrated in a timing diagram of FIG. 5, except that an abnormal state detector 170a maintains a current limit signal SCL as a logic high level until the DC-DC converter 100a is turned off. Once an abnormal state of a display panel is detected, the abnormal state detector 170a may stop a detecting operation, may generate a current limit signal SCL having a logic high level, and may maintain the current limit signal SCL as the logic high level until the DC-DC converter 100a is turned off.

Figure 7:
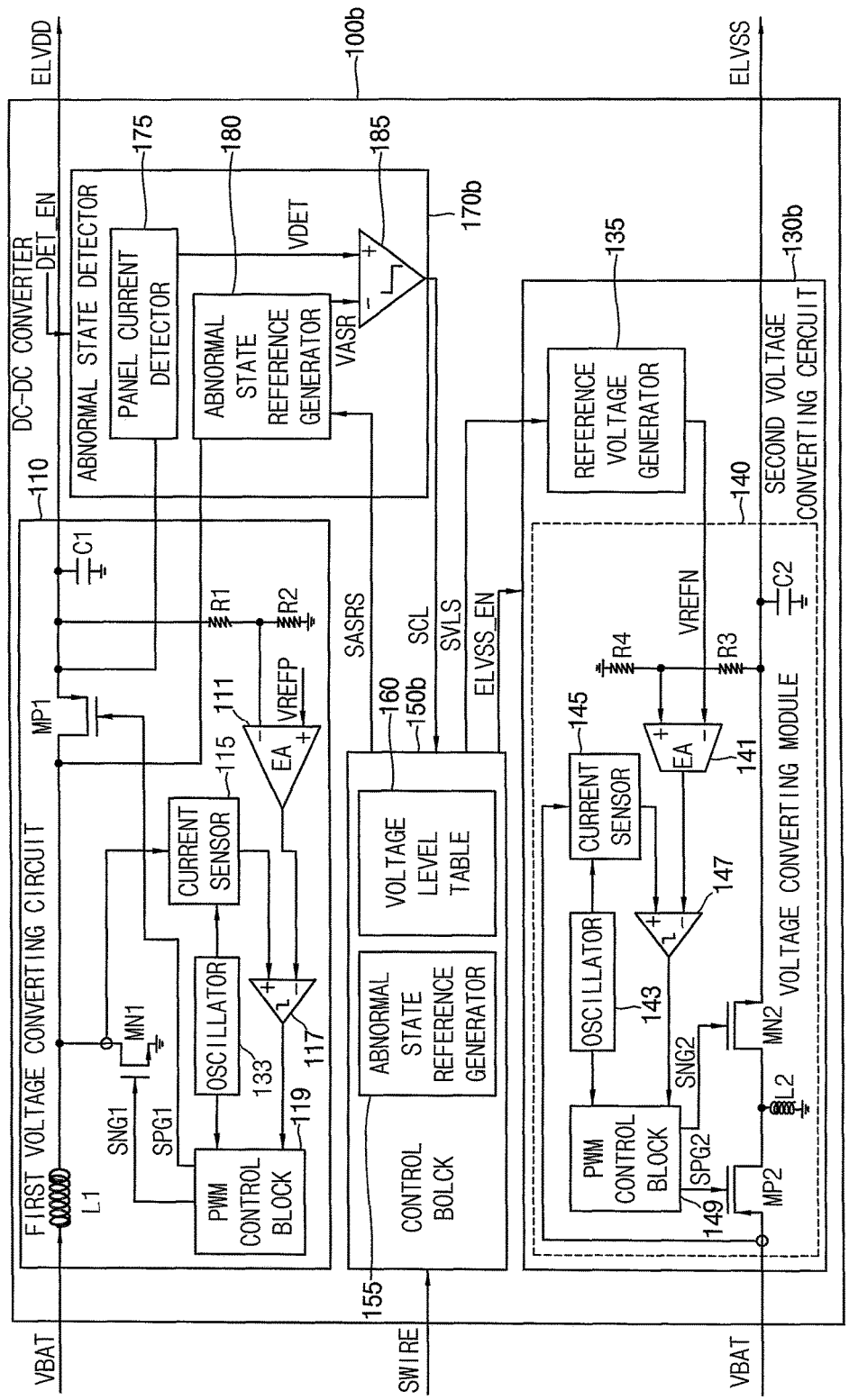
FIG. 7 is a block diagram illustrating an exemplary embodiment of a DC-DC converter.

FIG. 7 is a block diagram illustrating a DC-DC converter according to exemplary embodiments.

Referring to FIG. 7, a DC-DC converter for supplying first and second power supply voltages ELVDD and ELVSS to a display panel may include a first voltage converting circuit 110 that converts an input voltage VBAT into the first power supply voltage ELVDD, a second voltage converting circuit 130b that converts the input voltage VBAT into the second power supply voltage ELVSS, a control block 150b that controls a voltage level of the second power supply voltage ELVSS in response to an external control signal SWIRE, and an abnormal state detector 170b that detects an abnormal state of the display panel. The DC-DC converter 100b of FIG. 7 may have similar configurations and operations to those of a DC-DC converter 100a of FIG. 2, except that the control block 150b turns off the second voltage converting circuit 130b in response to a current limit signal SCL from the abnormal state detector 170b.

The abnormal state detector 170b may detect the abnormal state of the display panel, and, when the abnormal state is detected, may provide the current limit signal SCL to the control block 150b. The control block 150b may provide a the power supply voltage enable signal ELVSS_EN having a logic low level to the second voltage converting circuit 130b in response to the current limit signal SCL. The second voltage converting circuit 130b may be inactivated or OFF in response to the power supply voltage enable signal ELVSS_EN having the logic low level. While the second voltage converting circuit 130b is turned off, the DC-DC converter 100b may supply the display panel with a ground voltage as the second power supply voltage ELVSS. Regardless of whether the second voltage converting circuit 130b is turned off, the first voltage converting circuit 110 may maintain a voltage level of the first power supply voltage ELVDD. Accordingly, in a display device including the DC-DC converter 100b according to exemplary embodiments, even when the abnormal state of the display panel occurs, the display panel may continuously display an image while the display panel and the DC-DC converter 100b are not damaged.

Figure 8:
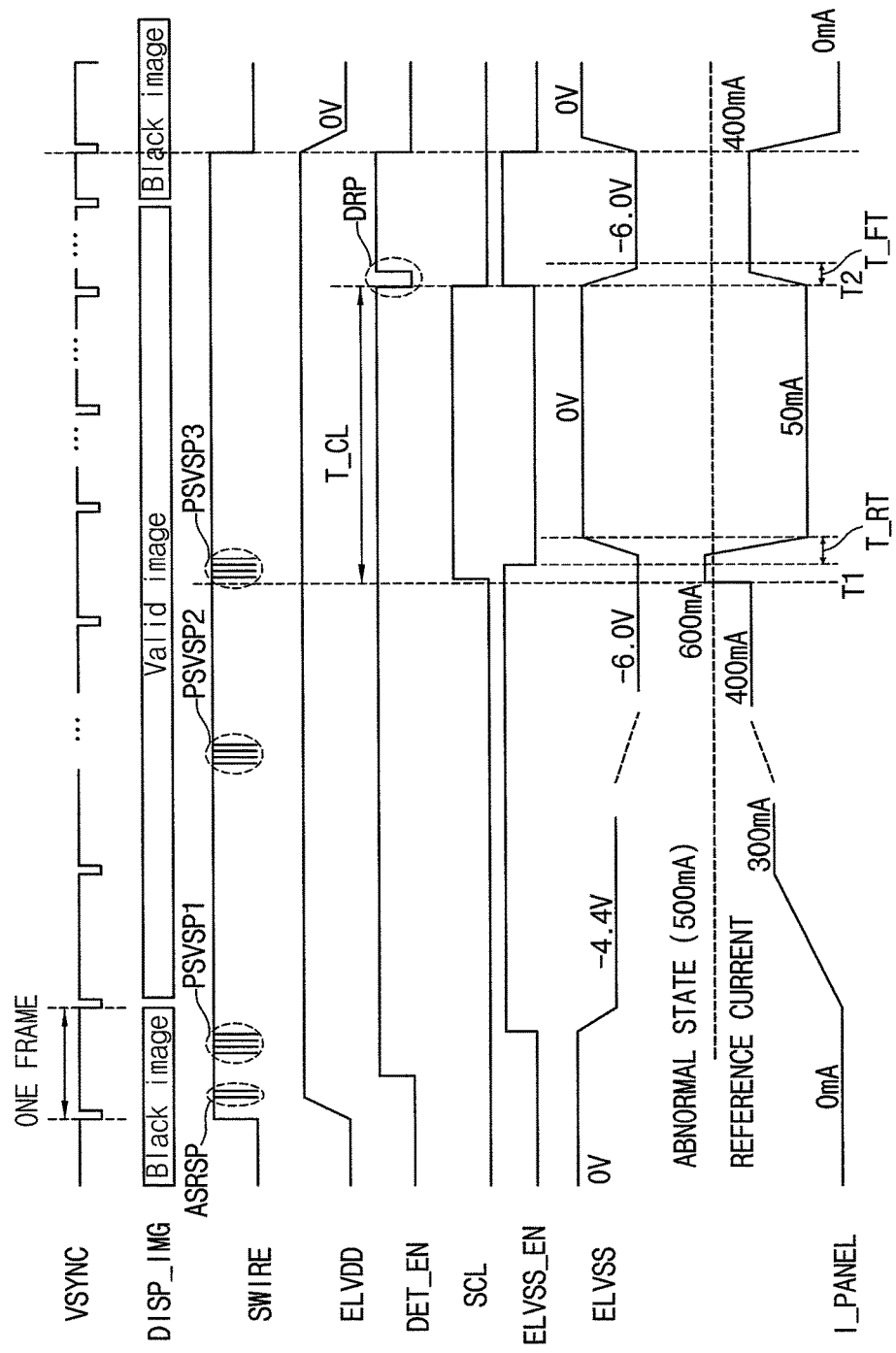
FIG. 8 is a timing diagram for describing an example of an operation of an exemplary embodiment of a DC-DC converter of FIG. 7.

FIG. 8 is a timing diagram for describing an example of an operation of a DC-DC converter of FIG. 7 according to exemplary embodiments.

Referring to FIGS. 7 and 8, a DC-DC converter 100b performing an operation illustrated in a timing diagram of FIG. 8 may perform substantially the same operation as a DC-DC converter 100a of FIG. 2 performing an operation illustrated in a timing diagram of FIG. 5, except that a control block 150b turns off a second voltage converting circuit 130b in response to a current limit signal SCL from an abnormal state detector 170b.

At a first time point T1, when an abnormal state of a display panel occurs, a panel current of the display panel may be increased to 600 mA that exceeds an abnormal state reference current of 500 mA. The abnormal state detector 170b may detect that the panel current of the display panel exceeds the abnormal state reference current, and may provide the current limit signal SCL having a logic high level to the control block 150b. The control block 150b may provide a power supply voltage enable signal ELVSS_EN having a logic low level to the second voltage converting circuit 130b in response to the current limit signal SCL having the logic high level. The second voltage converting circuit 130b may be turned off or inactivated in response to the power supply voltage enable signal ELVSS_EN having the logic low level. While the second voltage converting circuit 130b is turned off, the DC-DC converter 100b may supply the display panel with a ground voltage of 0 V as the second power supply voltage ELVSS. In some exemplary embodiments, as illustrated in FIG. 6, the second voltage converting circuit 130b may gradually change the second power supply voltage ELVSS from −6.0 V to 0 V with a predetermined slope during a predetermined time T_RT. When the second power supply voltage ELVSS is increased from −6.0 V to 0 V, and a voltage difference between the first power supply voltage ELVDD and the second power supply voltage ELVSS (i.e., the ground voltage) is reduced, a panel current flowing through the display panel may be reduced, for example from 600 mA to 50 mA. Accordingly, even when the abnormal state of the display panel occurs, the panel current may be reduced, and thus the display panel and the DC-DC converter 100b may be prevented from being damaged. Further, even when the abnormal state of the display panel occurs, the display panel may be continuously supplied with the first power supply voltage ELVDD, and thus the display panel may continuously display a valid image.

At a second time point T2 after a predetermined time T_CL from the time point T1 of the detection of the abnormal state, the control block 150b may transfer a detection enable signal DET_EN including a detection reset pulse DRP, and the abnormal state detector 170b may change the current limit signal SCL to a logic low level in response to the detection reset pulse DRP included in the detection enable signal DET_EN. Further, the control block 150b may provide the power supply voltage enable signal ELVSS_EN having a logic high level to the second voltage converting circuit 130b. The second voltage converting circuit 130b may resume a voltage converting operation that converts an input voltage VBAT to the second power supply voltage ELVSS in response to the power supply voltage enable signal ELVSS_EN having the logic high level. In some exemplary embodiments, as illustrated in FIG. 8, the second voltage converting circuit 130b may gradually change the second power supply voltage ELVSS from 0 V to −6.0 V with a predetermined slope during a predetermined time T_FT. In an exemplary embodiment, the second voltage converting circuit 130b may gradually change the second power supply voltage ELVSS using a soft start function, for example.

Figure 9:
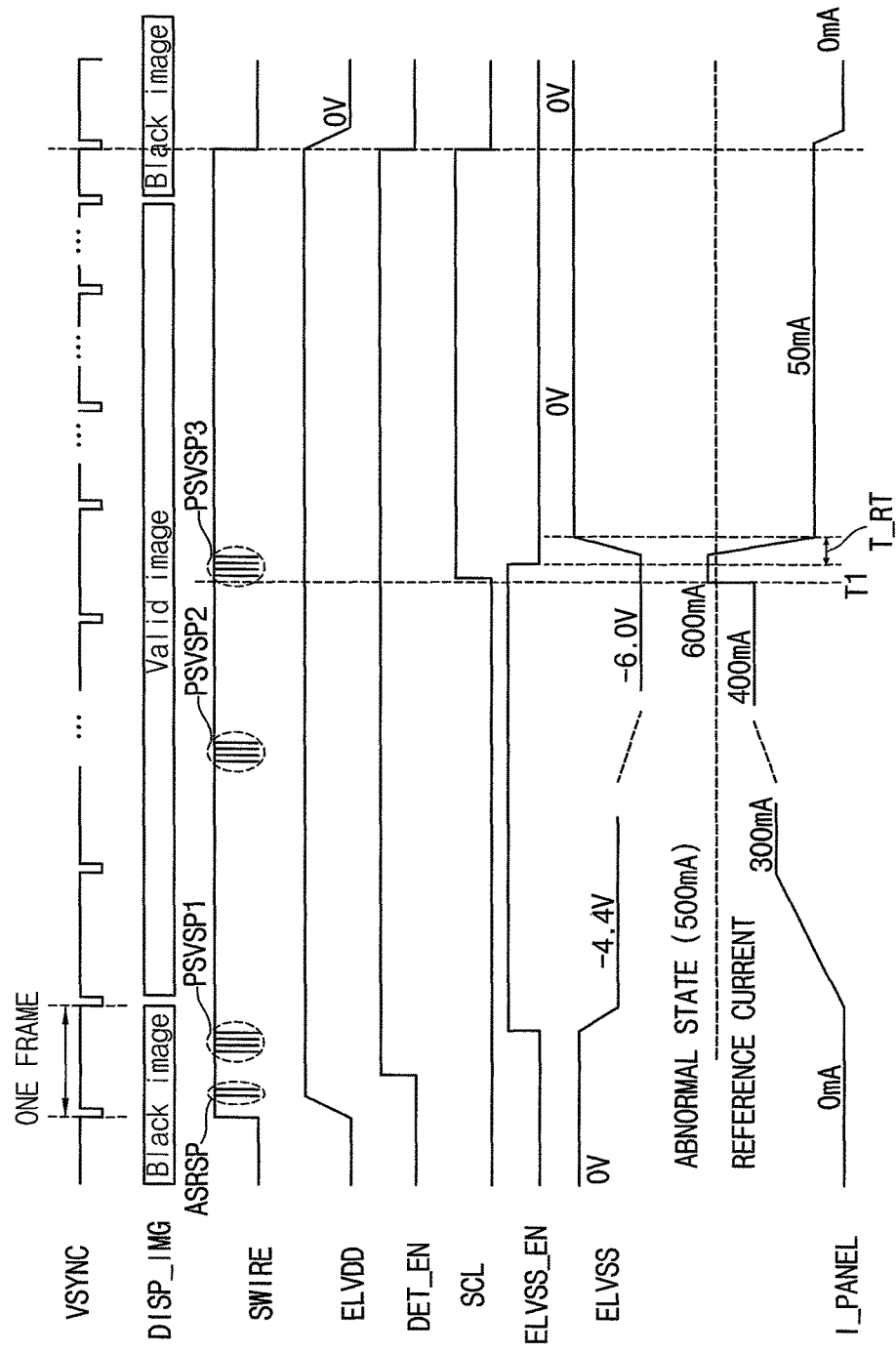
FIG. 9 is a timing diagram for describing another example of an operation of an exemplary embodiment of a DC-DC converter of FIG. 7.

FIG. 9 is a timing diagram for describing another example of an operation of a DC-DC converter of FIG. 7 according to exemplary embodiments.

Referring to FIGS. 7 and 9, a DC-DC converter 100b performing an operation illustrated in a timing diagram of FIG. 9 may perform substantially the same operation as the DC-DC converter 100b performing an operation illustrated in a timing diagram of FIG. 8, except that an abnormal state detector 170b maintains a current limit signal SCL as a logic high level until the DC-DC converter 100b is turned off. Once the abnormal state of the display panel is detected, the abnormal state detector 170b may stops a detecting operation, may generate the current limit signal SCL having a logic high level, and may maintain the current limit signal SCL as the logic high level until the DC-DC converter 100b is turned off FIG. 10 is a block diagram illustrating a DC-DC converter according to exemplary embodiments.

Figure 10:
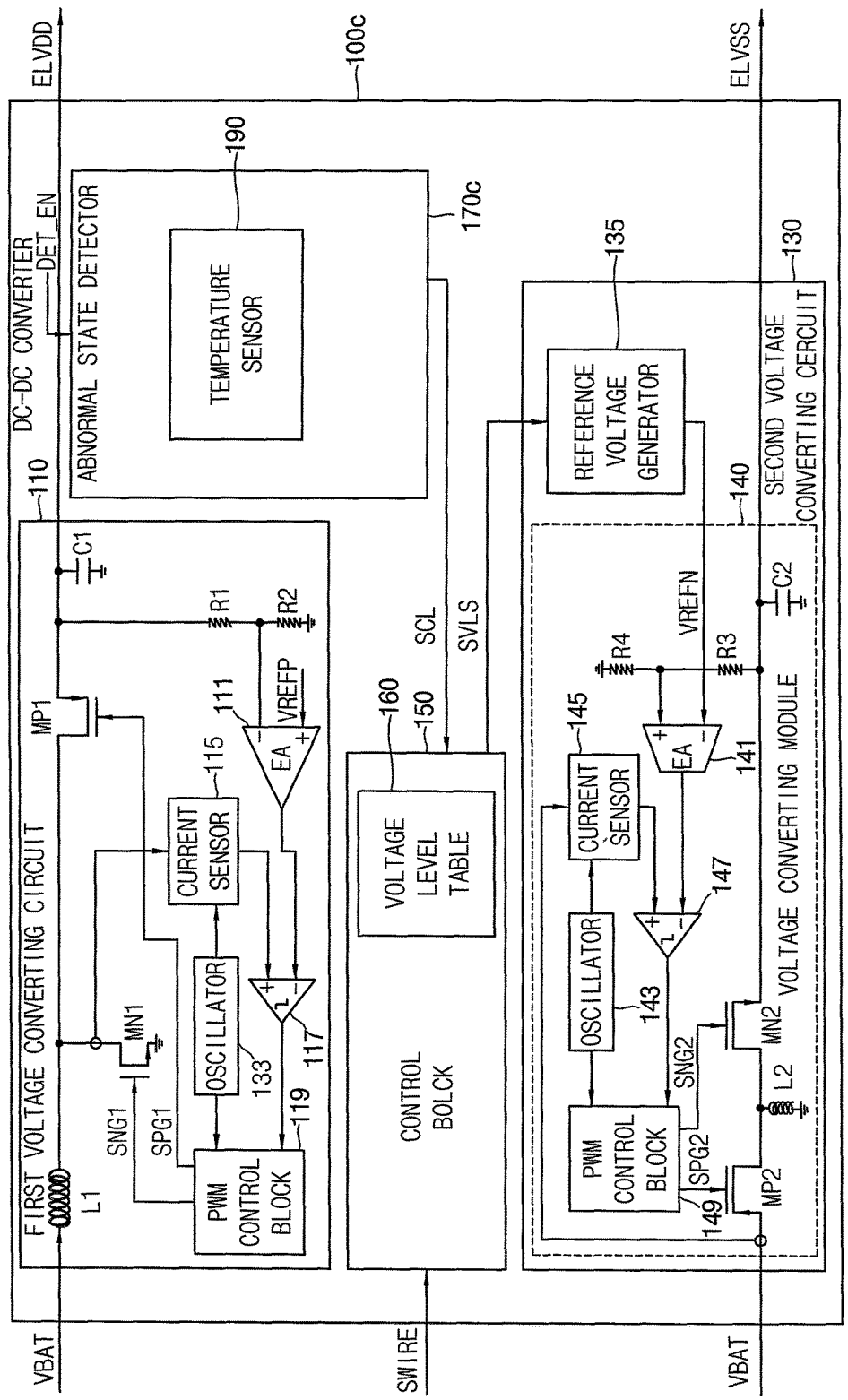
FIG. 10 is a block diagram illustrating an exemplary embodiment of a DC-DC converter.

Referring to FIG. 10, a DC-DC converter 100c for supplying first and second power supply voltages ELVDD and ELVSS to a display panel may include a first voltage converting circuit 110 that converts an input voltage VBAT into the first power supply voltage ELVDD, a second voltage converting circuit 130 that converts the input voltage VBAT into the second power supply voltage ELVSS, a control block 150 that controls a voltage level of the second power supply voltage ELVSS in response to an external control signal SWIRE, and an abnormal state detector 170c that detects an abnormal state of the display panel. The DC-DC converter 100c of FIG. 10 may have similar configurations and operations to those of a DC-DC converter 100a of FIG. 2 or a DC-DC converter 100b of FIG. 7, except that the abnormal state detector 170c includes a temperature sensor 190.

The abnormal state detector 170c may include the temperature sensor 190 that detects a temperature. The abnormal state detector 170c may generate a current limit signal SCL when the temperature detected by the temperature sensor 190 exceeds an abnormal state reference temperature. That is, the abnormal state detector 170c may determine that the display panel is in the abnormal state when the detected temperature exceeds the abnormal state reference temperature. The control block 150 may control the second voltage converting circuit 130 to forcibly change the second power supply voltage ELVSS to the highest voltage level among a plurality of voltage levels that are capable of being generated by the second voltage converting circuit 130, or may turn off the second voltage converting circuit 130 to output a ground voltage as the second power supply voltage ELVSS. Accordingly, in a display device including the DC-DC converter 100c according to exemplary embodiments, even when the abnormal state of the display panel occurs, the display panel may continuously display an image while the display panel and the DC-DC converter 100c are not damaged.

Figure 11:
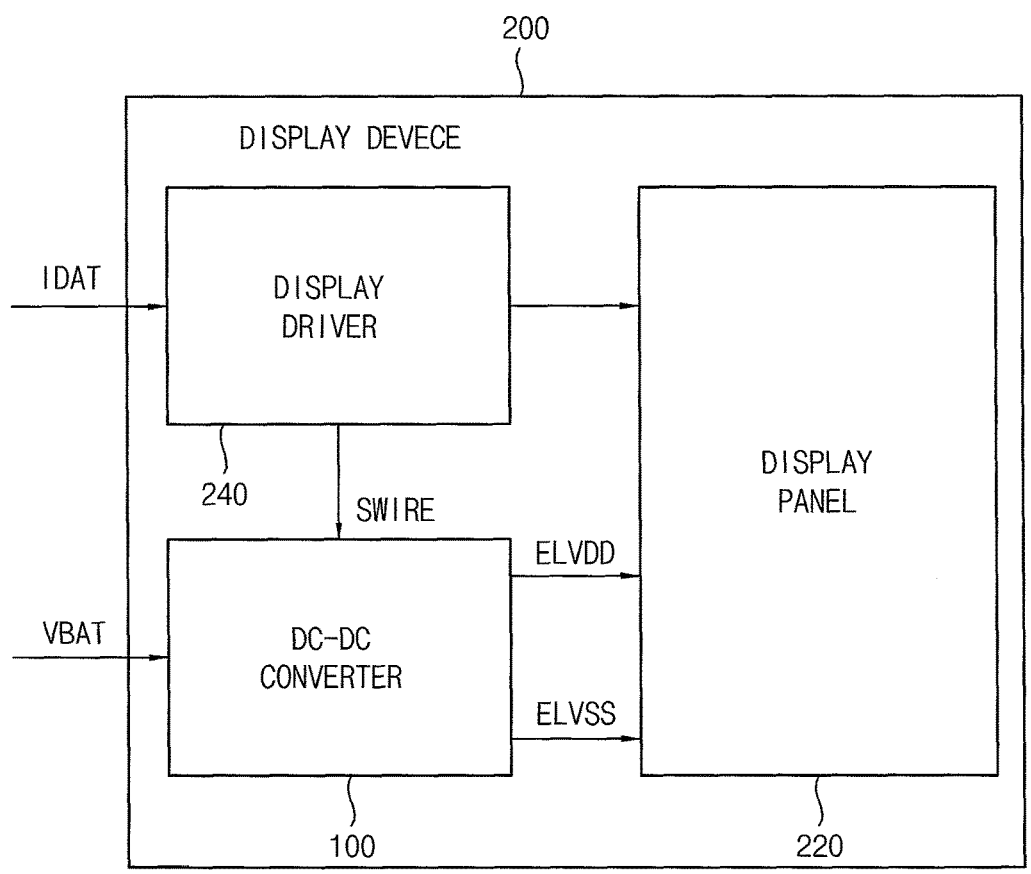
FIG. 11 is a block diagram illustrating an exemplary embodiment of a display device including a DC-DC converter.

FIG. 11 is a block diagram illustrating a display device including a DC-DC converter according to exemplary embodiments.

Referring to FIG. 11, a display device 200 may include a display panel 220, a DC-DC converter 100 that supplies the display panel 220 with a first power supply voltage ELVDD and a second power supply voltage ELVSS, and a display driver 240 that drives the display panel 220 based on input data IDAT.

The display panel 220 may be an OLED display panel including OLEDs that emit light based on a voltage difference between the first power supply voltage ELVDD and the second power supply voltage ELVSS. The display driver 240 may drive the display panel 220 to display an image based on the input data IDAT. In some exemplary embodiments, the display driver 240 may include a data driver, a scan driver and a timing controller.

The DC-DC converter 100 may be a DC-DC converter 100a of FIG. 2, a DC-DC converter 100b of FIG. 7 or a DC-DC converter 100c of FIG. 10. The DC-DC converter 100 may convert an input voltage VBAT into a first power supply voltage ELVDD and a second power supply voltage ELVSS. The DC-DC converter 100 may control a voltage level of the second power supply voltage ELVSS in response to an external control signal SWIRE from the display driver 240. Further, the DC-DC converter 100 may detect an abnormal state of the display panel 220, and, when the abnormal state is detected, may forcibly change the voltage level of the second power supply voltage ELVSS while maintaining a voltage level of the first power supply voltage ELVDD. Accordingly, in the display device 200 according to exemplary embodiments, even when the abnormal state of the display panel 220 occurs, the display panel 220 may continuously display an image while the display panel 220 and the DC-DC converter 100 are not damaged.

Figure 12:
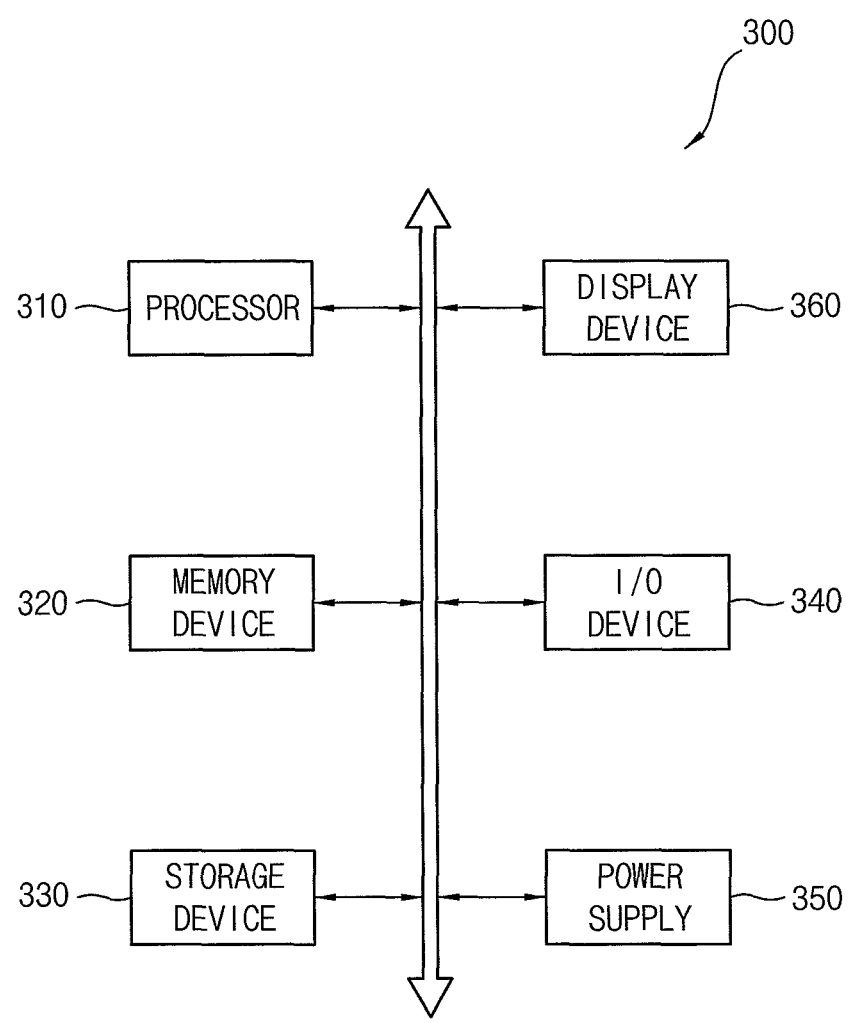
FIG. 12 is a block diagram illustrating an exemplary embodiment of an electronic device including a display device.

FIG. 12 is a block diagram illustrating an electronic device including a display device according to exemplary embodiments.

Referring to FIG. 12, an electronic device 300 may include a processor 310, a memory device 320, a storage device 330, an input/output ("I/O") device 340, a power supply 350 and a display device 360. In an exemplary embodiment, the electronic device 300 may further include a plurality of ports for communicating a video card, a sound card, a memory card, a universal serial bus ("USB") device, other electronic devices, etc., for example.

The processor 310 may perform various computing functions or tasks. In some exemplary embodiments, processor 310 may be an application processor ("AP"), a central processing unit ("CPU"), a graphics processing unit ("GPU"), a micro processor, etc., for example. The processor 310 may be coupled to other components via an address bus, a control bus, a data bus, etc. In an exemplary embodiment, the processor 310 may be coupled to an extended bus such as a peripheral component interconnection ("PCI") bus, for example.

The memory device 320 may store data for operations of the electronic device 300. In an exemplary embodiment, the memory device 320 may include at least one non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, etc., and/or at least one volatile memory device such as a dynamic random access memory ("DRAM") device, a static random access memory ("SRAM") device, a mobile DRAM device, etc., for example.

In an exemplary embodiment, the storage device 330 may be a solid state drive ("SSD") device, a hard disk drive ("HDD") device, a CD-ROM device, etc. In an exemplary embodiment, the I/O device 340 may be an input device such as a keyboard, a keypad, a mouse device, a touchpad, a touch-screen, a remote controller, etc., and an output device such as a printer, a speaker, etc., for example. The power supply 350 may provide power for operations of the electronic device 300. The display device 360 may be coupled to other components via the buses or other communication links.

The display device 360 may include a DC-DC converter that converts an input voltage into first and second power supply voltages. The DC-DC converter may detect an abnormal state of a display panel, and, when the abnormal state is detected, may forcibly change a voltage level of the second power supply voltage while maintaining a voltage level of the first power supply voltage. Accordingly, even when the abnormal state of the display panel occurs, the display panel may continuously display an image while the display device 360 is not damaged.

In some exemplary embodiments, the electronic device 300 may be a portable electronic device, such as a smart phone, a mobile phone, a tablet computer, etc. In other exemplary embodiments, the electronic device 300 may be any electronic device including the display device 360, such as a digital television ("TV"), a three dimensional ("3D") TV, a personal computer ("PC"), a home appliance, a laptop computer, a personal digital assistant ("PDA"), a portable multimedia player ("PMP"), a digital camera, a music player, a portable game console, a navigation device, etc.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A direct current to direct current converter for supplying a first power supply voltage and a second power supply voltage to a display panel, the direct current to direct current converter comprising:
   a first voltage converting circuit which converts an input voltage into the first power supply voltage;
   a control block which stores information about a plurality of voltage levels of the second power supply voltage, to receive an external control signal, and to generate a voltage level selection signal indicating a first one of the plurality of voltage levels corresponding to the external control signal;
   a second voltage converting circuit which converts the input voltage into the second power supply voltage having the first one of the plurality of voltage levels indicated by the voltage level selection signal; and
   an abnormal state detector which detects an abnormal state of the display panel, and to provide a current limit signal to the control block when the abnormal state is detected,
   wherein, in response to the current limit signal, the control block generates the voltage level selection signal indicating a second one of the plurality of voltage levels regardless of the external control signal such that the second voltage converting circuit forcibly changes the second power supply voltage from the first one of the plurality of voltage levels to the second one of the plurality of voltage levels.

2. The direct current to direct current converter of claim 1, wherein a voltage difference between the first power supply voltage and the second power supply voltage having the second one of the plurality of voltage levels is less than a voltage difference between the first power supply voltage and the second power supply voltage having the first one of the plurality of voltage levels.

3. The direct current to direct current converter of claim 1, wherein the second one of the plurality of voltage levels is a voltage level closest to a voltage level of the first power supply voltage among the plurality of voltage levels.

4. The direct current to direct current converter of claim 1, wherein the first power supply voltage is a high power supply voltage having a fixed voltage level,
    wherein the second power supply voltage is a low power supply voltage, and
    wherein the second one of the plurality of voltage levels is a highest voltage level among the plurality of voltage levels of the low power supply voltage which are capable of being generated by the second voltage converting circuit.

5. The direct current to direct current converter of claim 1, wherein the abnormal state detector detects a panel current flowing through the display panel, and generates the current limit signal when the panel current exceeds an abnormal state reference current.

6. The direct current to direct current converter of claim 1, wherein the abnormal state detector includes:
    a panel current detector which detects a panel current flowing through the display panel, and generates a detection voltage corresponding to the panel current;
    an abnormal state reference generator which generates an abnormal state reference voltage corresponding to an abnormal state reference current; and
    a comparator which compares the detection voltage with the abnormal state reference voltage, and generates the current limit signal when the detection voltage exceeds the abnormal state reference voltage.

7. The direct current to direct current converter of claim 6, wherein the external control signal includes abnormal state reference setting pulses,
    wherein the control block further stores information about a plurality of current levels of the abnormal state reference current, and generates, in response to the abnormal state reference setting pulses, an abnormal state reference selection signal indicating a current level corresponding to a number of the abnormal state reference setting pulses among the plurality of current levels, and
    wherein the abnormal state reference generator generates the abnormal state reference voltage having a voltage level corresponding to the current level indicated by the abnormal state reference selection signal.

8. The direct current to direct current converter of claim 7, wherein the control block includes:
    an abnormal state reference table storing the information about the plurality of current levels of the abnormal state reference current respectively corresponding to the number of the abnormal state reference setting pulses.

9. The direct current to direct current converter of claim 1, wherein the second voltage converting circuit includes:
    a reference voltage generator which generates a reference voltage corresponding to the voltage level selection signal; and
    a voltage converting module which converts the input voltage into the second power supply voltage corresponding to the reference voltage.

10. The direct current to direct current converter of claim 9, wherein the external control signal includes power supply voltage setting pulses,
    wherein the control block generates, in response to the power supply voltage setting pulses, the voltage level selection signal indicating the first one of the plurality of voltage levels corresponding to a number of the power supply voltage setting pulses, and generates, in response to the current limit signal, the voltage level selection signal indicating the second one of the plurality of voltage levels regardless of the number of the power supply voltage setting pulses, and
    wherein the reference voltage generator generates the reference voltage having a voltage level corresponding to the first one of the plurality of voltage levels of the second power supply voltage in response to the voltage level selection signal indicating the first one of the plurality of voltage levels, and changes the voltage level of the reference voltage to another voltage level corresponding to the second one of the plurality of voltage levels of the second power supply voltage in response to the voltage level selection signal indicating the second one of the plurality of voltage levels.

11. The direct current to direct current converter of claim 10, wherein the control block includes:
    a voltage level table storing the information about the plurality of voltage levels of the second power supply voltage respectively corresponding to the number of the power supply voltage setting pulses.

12. The direct current to direct current converter of claim 1, wherein, when the second power supply voltage is changed from the first one of the plurality of voltage levels to the second one of the plurality of voltage levels, the second voltage converting circuit gradually changes the second power supply voltage from the first one of the plurality of voltage levels to the second one of the plurality of voltage levels during a predetermined time.

13. The direct current to direct current converter of claim 1, wherein the abnormal state detector initiates a detecting operation for the abnormal state of the display panel in response to a detection enable signal,
    wherein, when the abnormal state is detected, the abnormal state detector stops the detecting operation, generates the current limit signal having a logic high level, and maintains the current limit signal as the logic high level until a detection reset pulse is received, and
    wherein, in response to the detection reset pulse, the abnormal state detector resumes the detecting operation, and changes the current limit signal to a logic low level.

14. The direct current to direct current converter of claim 13, wherein, in response to the current limit signal having the logic low level, the control block generates the voltage level selection signal indicating the first one of the plurality of voltage levels such that the second voltage converting circuit changes the second power supply voltage from the second one of the plurality of voltage levels to the first one of the plurality of voltage levels.

15. The direct current to direct current converter of claim 1, wherein, when the abnormal state is detected, the abnormal state detector stops a detecting operation, generates the current limit signal having a logic high level, and maintains the current limit signal as the logic high level until the direct current to direct current converter is powered off.

16. The direct current to direct current converter of claim 1, wherein the abnormal state detector includes a temperature sensor which detects a temperature, and
    wherein the abnormal state detector generates the current limit signal when the detected temperature exceeds an abnormal state reference temperature.

17. A direct current to direct current converter for supplying a first power supply voltage and a second power supply voltage to a display panel, the direct current to direct current converter comprising:
- a first voltage converting circuit which converts an input voltage into the first power supply voltage;
- a control block which stores information about a plurality of voltage levels of the second power supply voltage, to receive an external control signal, and generates a voltage level selection signal indicating a voltage level corresponding to the external control signal among the plurality of voltage levels;
- a second voltage converting circuit which converts the input voltage into the second power supply voltage having the voltage level indicated by the voltage level selection signal; and
- an abnormal state detector which detects an abnormal state of the display panel, and provides a current limit signal to the control block when the abnormal state is detected,
- wherein the control block turns off the second voltage converting circuit in response to the current limit signal.

18. The direct current to direct current converter of claim 17, wherein, when the second voltage converting circuit is turned off, the direct current to direct current converter supplies a ground voltage as the second power supply voltage to the display panel.

19. The direct current to direct current converter of claim 17, wherein the first voltage converting circuit maintains a voltage level of the first power supply voltage regardless of whether the second voltage converting circuit is turned off.

20. A display device comprising:
a display panel; and
a direct current to direct current converter for supplying a first power supply voltage and a second power supply voltage to the display panel, the direct current to direct current converter comprising:
- a first voltage converting circuit which converts an input voltage into the first power supply voltage;
- a control block which stores information about a plurality of voltage levels of the second power supply voltage, receives an external control signal, and to generate a voltage level selection signal indicating a first one of the plurality of voltage levels corresponding to the external control signal;
- a second voltage converting circuit which converts the input voltage into the second power supply voltage having the first one of the plurality of voltage levels indicated by the voltage level selection signal; and
- an abnormal state detector which detects an abnormal state of the display panel, and provides a current limit signal to the control block when the abnormal state is detected,
wherein, in response to the current limit signal, the control block generates the voltage level selection signal indicating a second one of the plurality of voltage levels regardless of the external control signal such that the second voltage converting circuit forcibly changes the second power supply voltage from the first one of the plurality of voltage levels to the second one of the plurality of voltage levels.

* * * * *